US008106345B2

(12) United States Patent
Kim et al.

(10) Patent No.: US 8,106,345 B2
(45) Date of Patent: Jan. 31, 2012

(54) PHOTO SENSOR AND FLAT PANEL DISPLAY USING THE SAME

(75) Inventors: Do-Youb Kim, Suwon-si (KR); Su-Young Kim, Suwon-si (KR); Eun-Jung Lee, Suwon-si (KR); Dong-Wook Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 531 days.

(21) Appl. No.: 12/340,359

(22) Filed: Dec. 19, 2008

(65) Prior Publication Data

US 2009/0206378 A1 Aug. 20, 2009

(30) Foreign Application Priority Data

Feb. 19, 2008 (KR) ........................ 10-2008-0014834

(51) Int. Cl.
*H01L 27/14* (2006.01)
*H01L 29/78* (2006.01)
*H01L 33/00* (2010.01)

(52) U.S. Cl. .................. 250/214 AL; 345/207; 257/431

(58) Field of Classification Search ............ 250/214 AL, 250/214 B; 345/204, 207; 257/40, 431
See application file for complete search history.

(56) References Cited

U.S. PATENT DOCUMENTS 6,489,631 B2 * 12/2002 Young et al. .................... 257/59
6,975,008 B2 12/2005 Cok
7,554,514 B2 * 6/2009 Nozawa .......................... 345/82
7,733,336 B2 * 6/2010 Lim .............................. 345/207
7,859,486 B2 * 12/2010 Kwon ............................. 345/66
2005/0007353 A1 1/2005 Smith et al.
2005/0225683 A1 * 10/2005 Nozawa ........................ 348/801
2006/0108511 A1 * 5/2006 Cok et al. .................. 250/214 R
2006/0158542 A1 * 7/2006 Mizuno et al. ................ 348/308
(Continued)

FOREIGN PATENT DOCUMENTS

JP 11-313257 11/1999
(Continued)

OTHER PUBLICATIONS

Japanese Office action dated Jan. 4, 2011, for corresponding Japanese Patent application 2008-122654, as well as JP 2007-511751.

(Continued)

*Primary Examiner* — John Lee
(74) *Attorney, Agent, or Firm* — Christie, Parker & Hale, LLP

(57) ABSTRACT

A photo sensor in a flat panel display includes a first transistor having first, second, and gate electrodes respectively coupled to first, second, and third nodes; a second transistor having first, second, and gate electrodes, respectively coupled to a fourth node, the first node, and a first control signal line; a third transistor having first, second, and gate electrodes, respectively coupled to the second node, the third node, and the first control signal line; a fourth transistor having first, second, and gate electrodes, respectively coupled to a reset power line, the third node, and a reset signal line; a fifth transistor having first, second, and gate electrodes, respectively coupled to a first power source, the first node, and a second control signal line; a sixth transistor having first, second, and gate electrodes, respectively coupled to the second node, output line, and the second control signal line; and a seventh transistor.

14 Claims, 6 Drawing Sheets

U.S. PATENT DOCUMENTS

| | | | | |
|---|---|---|---|---|
| 2006/0273998 | A1* | 12/2006 | Young | 345/81 |
| 2007/0001942 | A1 | 1/2007 | Johnson et al. | |
| 2007/0138951 | A1* | 6/2007 | Park et al. | 313/504 |
| 2009/0140957 | A1* | 6/2009 | Park et al. | 345/76 |
| 2009/0201228 | A1* | 8/2009 | Kim et al. | 345/60 |
| 2009/0206378 | A1* | 8/2009 | Kim et al. | 257/292 |
| 2010/0013811 | A1* | 1/2010 | Ahn et al. | 345/207 |
| 2010/0096997 | A1* | 4/2010 | Ahn et al. | 315/158 |
| 2010/0097354 | A1* | 4/2010 | Ahn et al. | 345/175 |

FOREIGN PATENT DOCUMENTS

| | | | |
|---|---|---|---|
| JP | 2001-145024 | A | 5/2001 |
| JP | 2003-536115 | A | 12/2003 |
| JP | 2007-511751 | A | 5/2007 |
| KR | 2002-0025978 | | 4/2002 |
| KR | 10-2004-0106635 | | 12/2004 |
| KR | 10-2006-0107525 | | 10/2006 |
| KR | 10-2007-0042727 | | 4/2007 |
| KR | 10-2007-0107906 | | 11/2007 |
| WO | WO 01/99191 | A1 | 12/2001 |
| WO | WO 2005/045380 | A1 | 5/2005 |

OTHER PUBLICATIONS

KIPO Office action dated Apr. 12, 2010, for priority Korean Patent application 10-2008-0014834.

Japanese Office Action dated May 6, 2010 of the corresponding Japanese Patent Application No. 2008-122654.

* cited by examiner

PHOTO SENSOR AND FLAT PANEL DISPLAY USING THE SAME

CROSS-REFERENCE TO RELATED APPLICATION

This application claims priority to and the benefit of Korean Patent Application No. 10-2008-0014834, filed on Feb. 19, 2008, in the Korean Intellectual Property Office, the entire content of which is incorporated herein by reference.

BACKGROUND

1. Field of the Invention

The present invention relates to a photo sensor and a flat panel display using the same.

2. Discussion of Related Art

In recent years a variety of flat panel display devices having reduced weight and volume in comparison to a cathode ray tube (CRT) have been developed. The flat panel display devices include a liquid crystal display (LCD), a field emission display (FED), a plasma display panel (PDP), an organic light emitting display (OLED), etc.

Among the flat panel display devices, the organic light emitting display displays an image using organic light emitting diodes (OLEDs) that emit light through recombination of electrons and holes.

The organic light emitting display has been increasingly used in the field of applications such as PDA, MP3 players in addition to mobile phones due to its various advantages such as excellent color reproduction and slimness.

An image displayed in the flat panel display devices shows variance in visibility according to the luminance of ambient light. In other words, although an image is displayed with the same luminance, the displayed image appears relatively dark when ambient light has high luminance, and the displayed image appears relatively bright when the ambient light has low luminance.

Thus, to improve visibility by sensing the luminance of ambient light, the luminance of the displayed image increased when the ambient light has high luminance and the luminance of the displayed image is decreased when the ambient light has low luminance. Also, when the luminance of the displayed image is controlled according to the luminance of the ambient light, there is no need to unnecessarily increase the luminance of the displayed image, such that it is possible to reduce power consumption.

Therefore, a method for controlling luminance of a displayed image in accordance with luminance of the ambient light, using a photo sensor for sensing the ambient light attached to a flat panel display device, has been developed.

However, the use of the photo sensor is difficult due to its low power output when the photo sensor is installed inside a panel of the flat panel display device.

SUMMARY OF THE INVENTION

Accordingly, the present invention is designed to solve such drawbacks of the prior art, and therefore an aspect of the present invention is to provide a photo sensor capable of stably driving a photo sensor by improving a power output of the photo sensor.

Also, an aspect of the present invention is to provide a flat panel display using the photo sensor. In one embodiment, the photo sensor is capable of controlling the luminance of a displayed image in accordance with the luminance of an ambient light.

One embodiment of the present invention is achieved by providing a photo sensor including a first transistor having a first electrode coupled to a first node, a second electrode coupled to a second node, and a gate electrode coupled to a third node; a second transistor having a first electrode coupled to a fourth node, a second electrode coupled to the first node, and a gate electrode coupled to a first control signal line; a third transistor having a first electrode coupled to the second node, a second electrode coupled to the third node, and a gate electrode coupled to the first control signal line; a fourth transistor having a first electrode coupled to a reset power line, a second electrode coupled to the third node, and a gate electrode coupled to a reset signal line; a fifth transistor having a first electrode coupled to a first power source, a second electrode coupled to the first node, and a gate electrode coupled to a second control signal line; a sixth transistor having a first electrode coupled to the second node, a second electrode coupled to an output line, and a gate electrode coupled to the second control signal line; a seventh transistor having a first electrode coupled to a second power source, a second electrode coupled to the fourth node, and a gate electrode coupled to the reset signal line; a photo diode having a cathode electrode coupled to a third power source and an anode electrode coupled to the fourth node; a first capacitor having a first electrode coupled to the third node and a second electrode coupled to the first power source; and a second capacitor having a first electrode coupled to the third power source and a second electrode coupled to the fourth node.

Another embodiment of the present invention is achieved by providing a flat panel display including a display unit for displaying an image corresponding to a data signal and a scan signal; a data driver for receiving an image signal to generate a data signal and transmitting the generated data signal to the display unit; a scan driver for generating a scan signal and transmitting the generated scan signal to the display unit; and a photo sensor for sensing luminance of an ambient light to control luminance of the image according to the luminance of the ambient light, wherein the photo sensor includes a first transistor having a first electrode coupled to a first node, a second electrode coupled to a second node, and a gate electrode coupled to a third node; a second transistor having a first electrode coupled to a fourth node, a second electrode coupled to the first node, and a gate electrode coupled to a first control signal line; a third transistor having a first electrode coupled to the second node, a second electrode coupled to the third node, and a gate electrode coupled to the first control signal line; a fourth transistor having a first electrode coupled to a reset power line, a second electrode coupled to the third node, and a gate electrode coupled to a reset signal line; a fifth transistor having a first electrode coupled to a first power source, a second electrode coupled to the first node, and a gate electrode coupled to a second control signal line; a sixth transistor having a first electrode coupled to the second node, a second electrode coupled to an output line, and a gate electrode coupled to the second control signal line; a seventh transistor having a first electrode coupled to a second power source, a second electrode coupled to the fourth node, and a gate electrode coupled to the reset signal line; a photo diode having a cathode electrode coupled to a third power source and an anode electrode coupled to the fourth node; a first capacitor having a first electrode coupled to the third node and a second electrode coupled to the first power source; and a second capacitor having a first electrode coupled to the third power source and a second electrode coupled to the fourth node.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
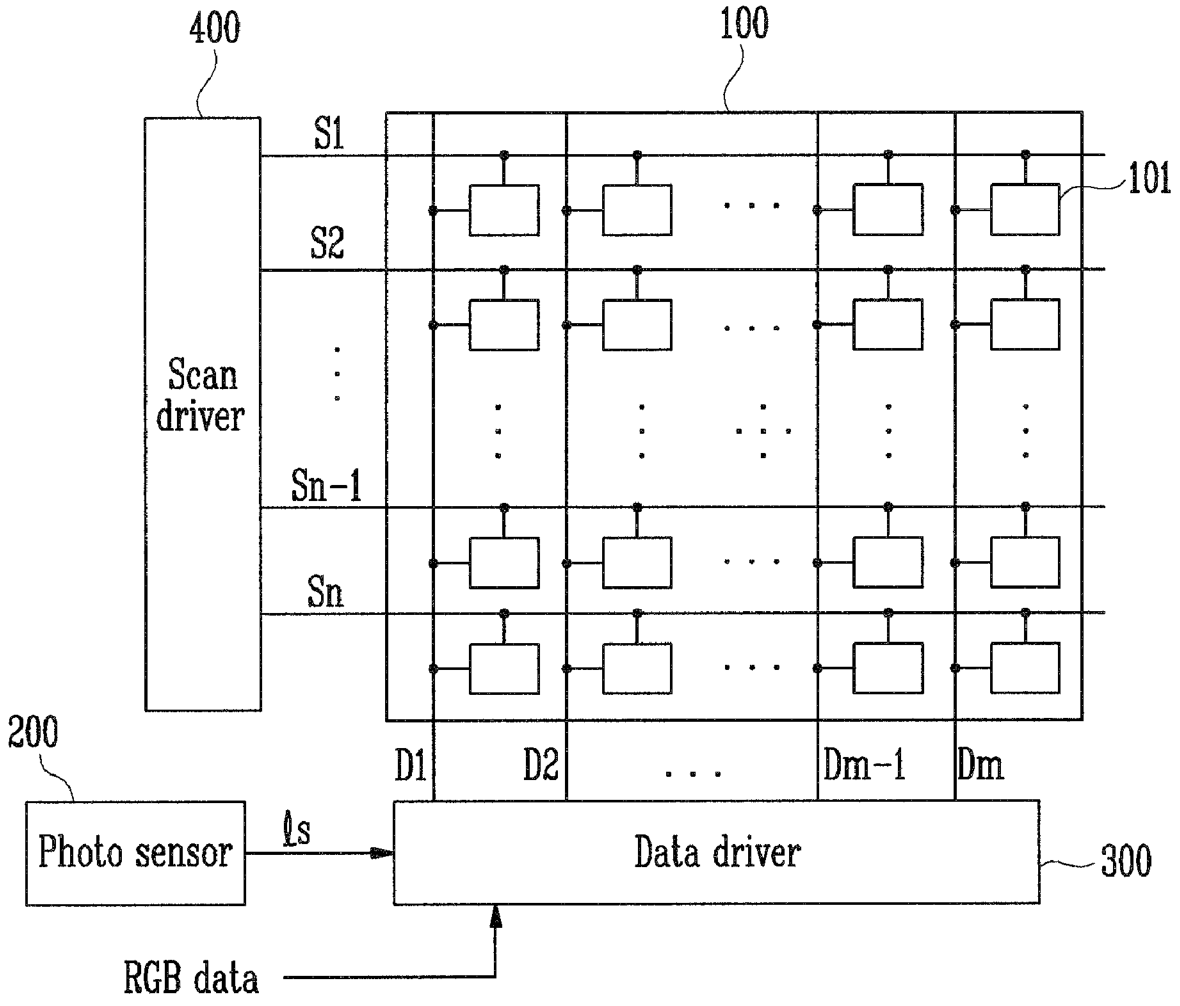
FIG. 1 is a block diagram of an organic light emitting display as one example of a flat panel display device according to the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via a third element. Further, some of the elements that are not essential to the complete understanding of the invention are omitted for clarity. Also, like reference numerals refer to like elements throughout.

FIG. 1 is a block diagram of an organic light emitting display as one example of a flat panel display device according to the present invention. Referring to FIG. 1, the organic light emitting display includes a display unit 100, a photo sensor 200, a data driver 300, and a scan driver 400.

The display unit 100 includes a plurality of pixels 101, and each of the pixels 101 includes an organic light emitting diode for emitting light according to the flow of an electric current. Further, the display unit 100 includes n scan lines S1,S2, . . . Sn−1, and Sn extending in a row direction to transmit a scan signal, and m data lines D1, D2, . . . Dm−1, and Dm extending in a column direction to transmit a data signal.

The display unit 100 is driven by receiving a drive power source and a base power source from the outside of the display unit. Therefore, the display unit 100 displays an image by emitting the light to correspond to the magnitude of an electric current when the electric current flows in the organic light emitting diode utilizing the scan signal, the data signal, the drive power source, and the base power source.

The photo sensor 200 senses ambient light to generate a light sensing signal Is so that the luminance of an image displayed in the display unit 100 can be controlled according to the luminance of the ambient light. The light sensing signal Is is transmitted to the data driver 300 to generate a data signal corresponding thereto. Also, the photo sensor 200 amplifies a power output of the light sensing signal Is.

The data driver 300 receives image signals (R, G, and B data) and a light sensing signal Is to generate a data signal, wherein each of the image signals (R, G, and B data) and the light sensing signal Is include red, blue and green color components. The data driver 300 is coupled to the data lines D1, D2, . . . Dm−1, and Dm of the display unit 100 to apply the generated data signal to the display unit 100.

The scan driver 400 is coupled to the scan lines S1,S2, . . . Sn−1, and Sn to transmit a scan signal to a certain row of the display unit 100. When the data signal outputted from the data driver 300 is transmitted to the pixels 101 to which the scan signal is transmitted, the pixels 101 generate a drive current. The drive current flows in the organic light emitting diode.

Figure 2:
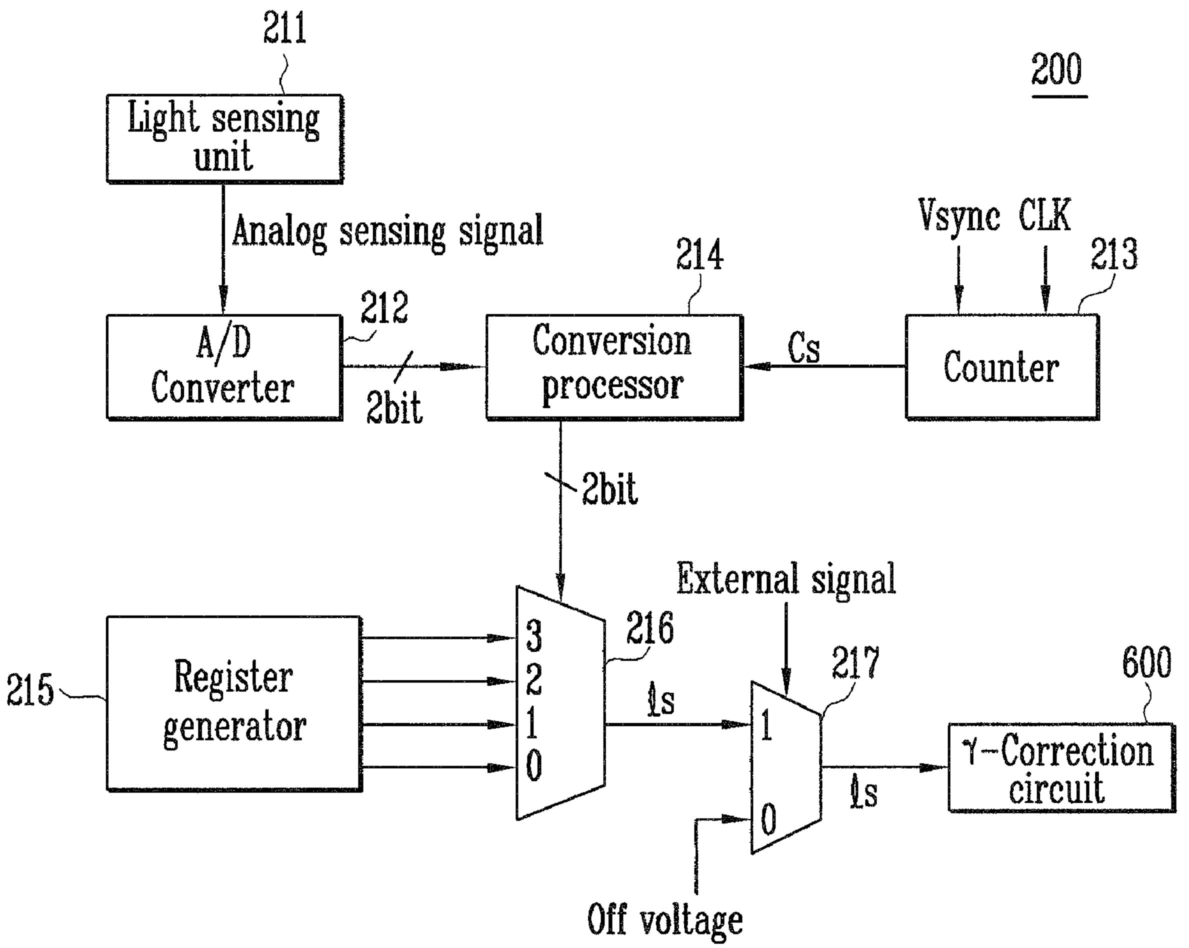
FIG. 2 is a block diagram showing a photo sensor used in the organic light emitting display shown in FIG. 1.

FIG. 2 is a configuration view showing a photo sensor 200 used in the organic light emitting display shown in FIG. 1. Referring to FIG. 2, the photo sensor 200 includes a light sensing unit 211, an A/D converter 212, a counter 213, a conversion processor 215, a register generator 215, a first selector 216 and a second selector 217. The photo sensor 200 may include a gamma correction circuit 600, or the gamma correction circuit 600 may be coupled to the photo sensor 200.

The light sensing unit 211 measures brightness of ambient light, classifies the brightness of the ambient light into a plurality of brightness levels, and outputs an analog sensing signal corresponding to each of the brightness levels. Here, the analog sensing signal corresponds to each of the brightness levels according to the magnitude of an electric current.

The A/D converter 212 compares the analog sensing signal outputted from the light sensing unit 211 with a set reference electric current, and outputs a digital sensing signal (e.g., 2 bit binary signal) corresponding to the analog sensing signal. For example, the A/D converter 212 outputs a '11' digital sensing signal in the brightest ambient brightness, and outputs a '10' digital sensing signal in a relatively bright ambient brightness. Also, the A/D converter 212 outputs a '01' digital sensing signal in a relatively dark ambient brightness, and outputs a '00' digital sensing signal in the darkest ambient brightness.

The counter 213 counts numbers (e.g., predetermined numbers) during a given time using vertical synchronization signals Vsync supplied from the outside, and outputs a counting signal Cs corresponding to the numbers. For convenience of description, it is assumed that the counter 213 uses a binary number of 4 bits, and the counter 213 is reset to '0000' when a vertical synchronization signal Vsync is inputted into the counter 213, and the counter 213 counts the number to '1111' while sequentially shifting a clock CLK signal. When another vertical synchronizing signal Vsync is inputted into the counter 213, the counter 213 is reset to an initial state. In this manner, the counter 213 counts the number from '0000' to '1111' during one frame period. The counter 213 outputs a counting signal Cs to the conversion processor 215, the counting signal Cs corresponding to the counted number. In practice, the counter 213 may have more than 4 bits.

The conversion processor 214 uses a counting signal Cs outputted from the counter 213 and a sensing signal outputted from the A/D converter 212 to output a control signal for selecting each of register setting values. In other words, the conversion processor 214 outputs a control signal corresponding to the digital sensing signal supplied by the A/D converter 212 when the counter 213 outputs the counting signal Cs. Also, the conversion processor 214 maintains the outputted control signal when another vertical synchronizing signal Vsync is inputted into the counter 213. Then, the conversion processor 214 resets the control signal when the next vertical synchronizing signal Vsync is inputted into the conversion processor 214, and outputs a control signal corresponding to the sensing signal outputted form the A/D converter 212. For example, the conversion processor 214 outputs a control signal corresponding to a sensing signal of '11' when the ambient light has the brightest brightness, and maintains the control signal during one frame period in which the counter 213 counts the control signal. On the contrary, when the ambient light is in the darkest state, the conversion processor 214 outputs a control signal corresponding to a sensing signal of '00', and maintains the control signal during one frame period in which the counter 213 counts the control signal. Also, when the ambient light is in a relatively bright or a relatively dark state, the conversion processor 214 outputs control signals corresponding to sensing signals of '10' or '01' in the same manner as described above, and maintains the control signal during one frame period.

The register generator 215 divides brightness of the ambient light into a plurality of brightness levels and stores a plurality of register setting values corresponding to the brightness levels.

The first selection unit 216 selects a register setting value corresponding to the control signal, which is set by the conversion processor 214, among a plurality of the register setting values stored in the register generator 215. Further, the first selector 216 outputs a light sensing signal Is corresponding to the selected register setting value.

The second selector 217 receives a 1-bit setting value from the outside (i.e., external signal), the 1-bit setting value being used to control a turn-on or turn-off state. The second selector 217 outputs the light sensing signal Is received from the first selector 216 when a setting value of '1' is selected in the second selector 217, and recognizes that the photo sensor 200 is in a turn-off state when a setting value of '0' is selected in the second selector 217.

The gamma correction circuit 600 generates a plurality of gamma correction signals corresponding to the light sensing signal Is generated according to the register setting values. Here, the gamma correction signal has different values according to the brightness of ambient light since the light sensing signal Is corresponds to the sensing signal outputted from the light sensing unit 211. The above-mentioned operation is independently performed in R, G and B pixels. The embodiments illustrated in FIG. 2 shows that the gamma correction circuit 600 is included in the photo sensor 200, but the gamma correction circuit 600 may be formed as a separate component from the photo sensor 200 in other embodiments.

Figure 3:
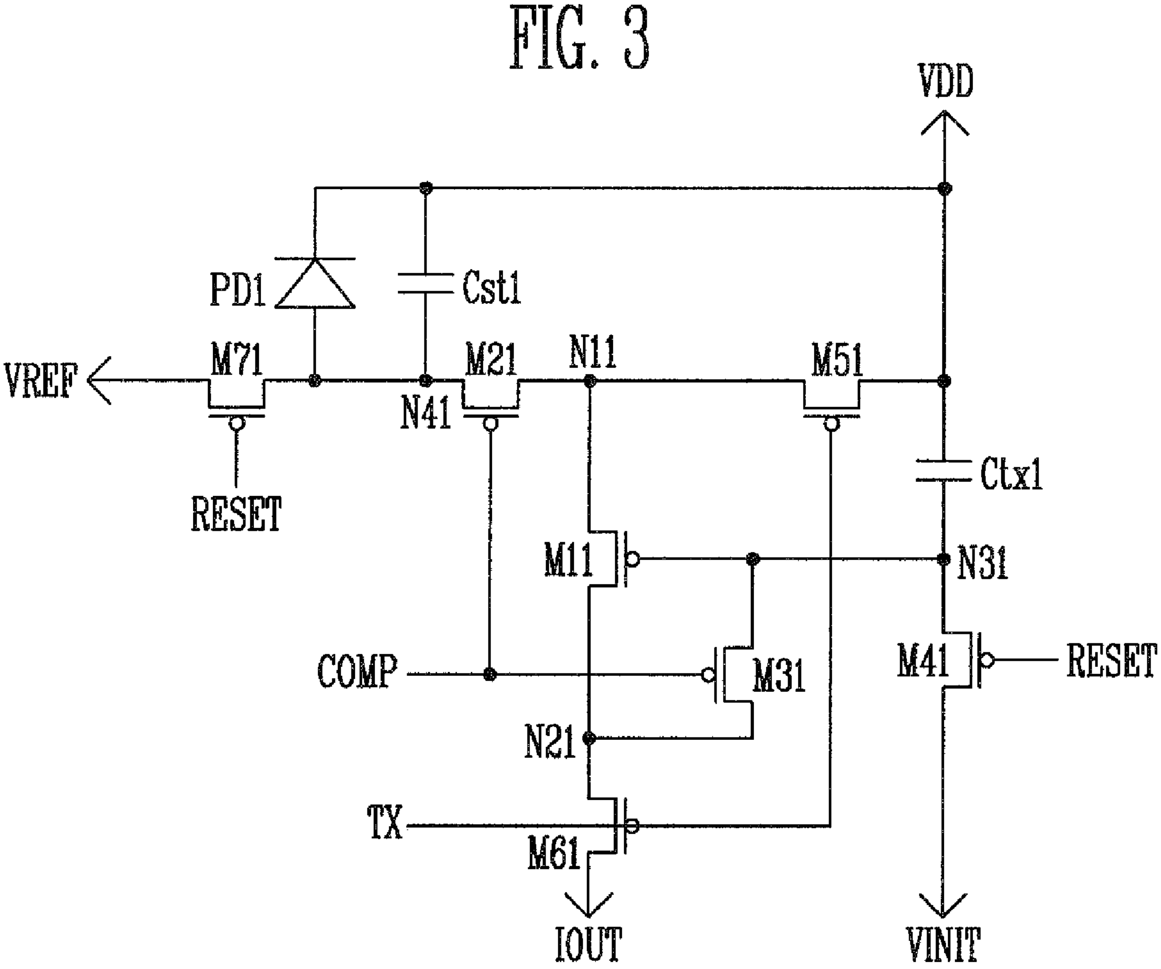
FIG. 3 is a circuit diagram showing one exemplary embodiment of a light sensing unit shown in FIG. 2.

FIG. 3 is a circuit diagram showing one exemplary embodiment of the light sensing unit 211 shown in FIG. 2. Referring to FIG. 3, the light sensing unit 211 includes a first transistor M11, a second transistor M21, a third transistor M31, a fourth transistor M41, a fifth transistor M51, a sixth transistor M61, a seventh transistor M71, a photo diode PD1, a first capacitor Ctx1, and a second capacitor Cst1.

A source electrode of the first transistor M11 is coupled to a first node N11, a drain electrode of the first transistor M11 is coupled to a second node N21, and a gate electrode of the first transistor M11 is coupled to a third node N31.

A source electrode of the second transistor M21 is coupled to a fourth node N41, a drain electrode of the second transistor M21 is coupled to a first node N11, and a gate electrode of the second transistor M21 is coupled to a first control signal line COMP.

A source electrode of the third transistor M31 is coupled to the second node N21, a drain electrode of the third transistor M31 is coupled to the third node N31, and a gate electrode of the third transistor M31 is coupled to a first control signal line COMP.

A source electrode of the fourth transistor M41 is coupled to a reset signal line VINIT, a drain electrode of the fourth transistor M41 is coupled to the third node N31, and a gate electrode of the fourth transistor M41 is coupled to a reset signal line RESET.

A source electrode of the fifth transistor M51 is coupled to a drive power line VDD, a drain electrode of the fifth transistor M51 is coupled to the first node N11, and a gate electrode of the fifth transistor M51 is coupled to a second control signal line TX.

A source electrode of the sixth transistor M61 is coupled to the second node N21, a drain electrode of the sixth transistor M61 is coupled to an output line IOUT, and a gate electrode of the sixth transistor M61 is coupled to the second control signal line TX.

A source electrode of the seventh transistor M71 is coupled to a reference power line VREF, a drain electrode of the seventh transistor M71 is coupled to the fourth node N41, and a gate electrode of the seventh transistor M71 is coupled to the reset signal line RESET.

A cathode electrode of the photo diode PD1 is coupled to the drive power line VDD, and an anode electrode of the photo diode PD1 is coupled to the fourth node N41.

A first electrode of the first capacitor Ctx1 is coupled to the third node N31, and a second electrode of the first capacitor Ctx1 is coupled to the drive power line VDD.

A first electrode of the second capacitor Cst1 is coupled to the drive power line VDD, and a second electrode of the second capacitor Cst1 is coupled to the fourth node N41, wherein the second capacitor Cst1 is coupled in parallel with the photo diode PD1.

Figure 4:
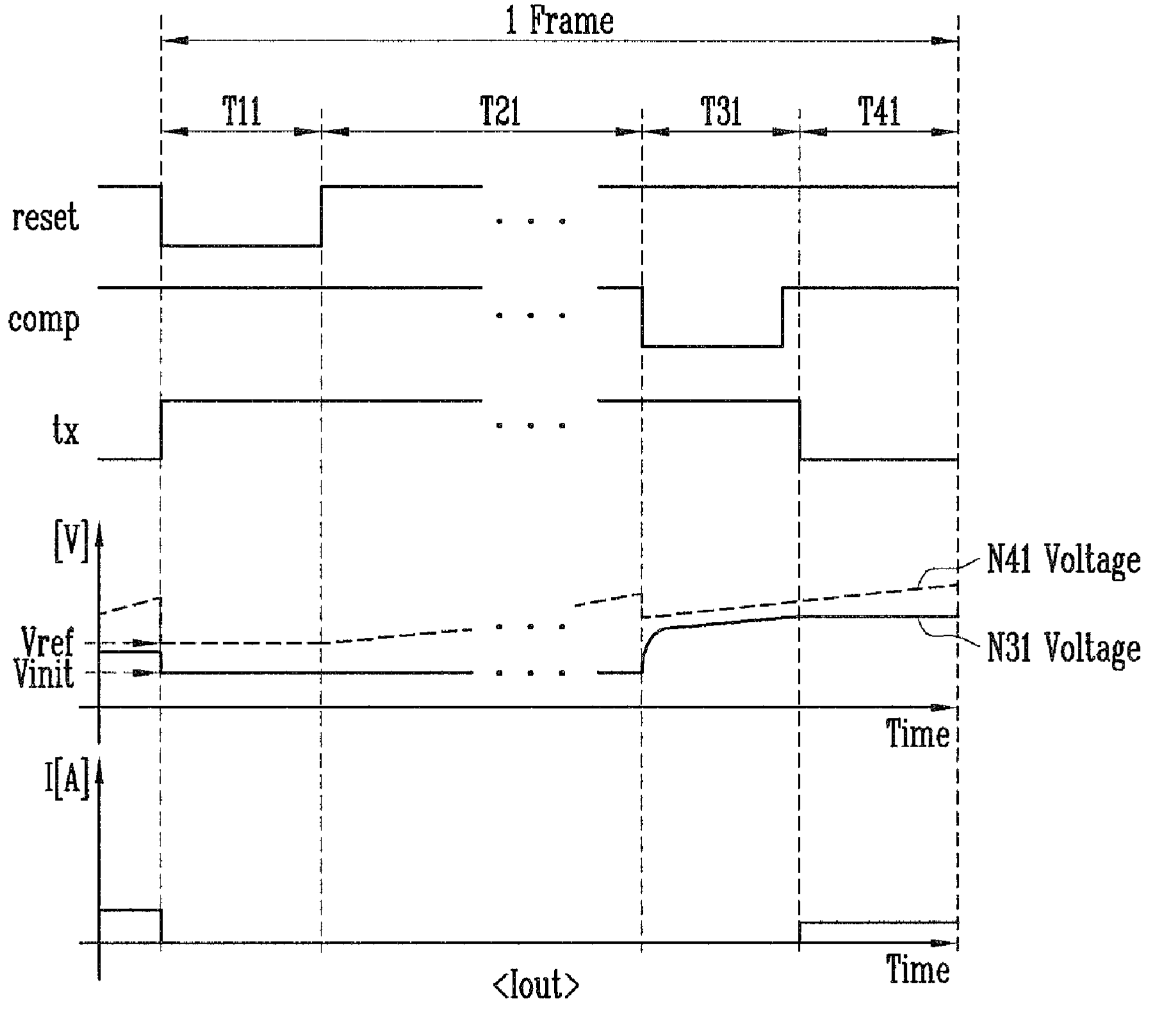
FIG. 4 is a timing diagram showing one exemplary embodiment of the operation of the light sensing unit shown in FIG. 3.

FIG. 4 is a timing diagram showing one exemplary embodiment of an operation of the light sensing unit 211 as shown in FIG. 3. Referring to FIG. 4, the light sensing unit 211 is separately driven during a first period T11, a second period T21, a third period T31 and a fourth period T41 into which one frame is divided. Here, the first period T11 is a period in which a reset signal reset transmitted through the reset signal line RESET is in a LOW level state, and a first control signal comp transmitted through the first control signal line COMP and a second control signal tx transmitted through the second control signal line TX are in a HIGH level state. The second period T21 is a period in which the reset signal reset, the first control signal comp and the second control signal tx are all in a HIGH level state. The third period T31 is a period in which the reset signal reset and the second control signal tx are in a HIGH level state, and the first control signal comp is in a LOW level state. The fourth period T41 is a period in which the reset signal reset and the first control signal comp are in a HIGH level state, and the second control signal tx is in a LOW level state.

First, during the first period T11, the fourth transistor M41 and the seventh transistor M71 are turned on (i.e., are in a turn-on state) because the reset signal reset is in a LOW level state and the first control signal comp and the second control signal tx are in a HIGH level state. Therefore, the reset voltage Vinit transmitted through the reset signal line VINIT is transmitted to the third node N31, and the reference voltage Vref transmitted through the reference power line VREF is transmitted to the fourth node N41. As a result, the third node N31 and the fourth node N41 are reset by the reset voltage Vinit and the reference voltage Vref, respectively.

During the second period T21, the second transistor M21 to the seventh transistor M71 are turned off (i.e., are in a turn-off state) because the reset signal reset, the first control signal comp and the second control signal tx are all in a HIGH level state. At this time, when the light is incident on the photo diode PD1, an electric current (i.e., a reverse current) flows from the cathode electrode to the anode electrode of the photo diode PD1, resulting in the increase in voltage of the fourth node N41. Therefore, the fourth node N41 has a voltage represented by the following Equation 1.

$$V_{N4}=Vref+\Delta V \quad \text{[Equation 1]}$$

Here, $V_{N4}$ represents a voltage of a fourth node N41, Vref represents a voltage transmitted through a reference power line VREF, and ΔV represents a voltage increased by a photo diode PD1.

During the third period T31, the second transistor M21 and the third transistor M31 are turned on (i.e., are in a turn-on state) because the reset signal reset and the second control signal tx are in a HIGH level state and the first control signal comp is in a LOW level. When the second and third transistors M21 and M31 are in the turn-on state, an electric current flows from the fourth node N41 to the third node N31. At this time, the drain electrode and the gate electrode of the first transistor M11 have the same voltage since the third transistor M31 is in a turn-on state. Therefore, the first transistor M11 is coupled through diodes, and an electric current flows from the fourth node N41 to the third node N31 via the first node N11, the first transistor M11, and the third transistor M31.

When the electric current flows to the third node N31, the third node N31 generates a voltage represented by the following Equation 2.

$$V_{N3}=V_{ref}+\Delta V-V_{th} \quad \text{[Equation 2]}$$

wherein, $V_{N3}$ represents a voltage of a third node N31, Vref represents a voltage transmitted through a reference power line VREF, ΔV represents a voltage increased by the photo diode PD1, and Vth represents a threshold voltage of the first transistor M11.

In other words, the voltage of the third node N31 becomes a voltage that is offset by the threshold voltage of the first transistor M11 from the voltage of the fourth node N41. Also, the voltage of the third node N31 continues to be increased during the third period T31 since the voltage of ΔV increases due to the presence of the photo diode PD1.

Also, the second capacitor Cst1 is electrically coupled to the first capacitor Ctx1 during the third period T31. Therefore, the voltages (i.e., electrical charges) stored in the first capacitor Ctx1 and the second capacitor Cst1 are distributed by the coupling action (i.e., charge sharing). However, if the first capacitor Ctx1 and the second capacitor Cst1 have a small difference in capacity (i.e., capacitance), the voltage stored in the second capacitor Cst1 would vary greatly when the electric coupling takes place. If the change in the voltage stored in the second capacitor Cst1 occurs, the voltage generated by the photo diode PD1 may not be transmitted to the gate electrode of the first transistor M11. Therefore, in one embodiment, the electrostatic capacity (i.e., capacitance) of the second capacitor Cst1 is greater than that of the first capacitor Ctx1. Therefore, the above-mentioned problem may be solved since the voltage stored in the second capacitor Cst1 does not change greatly. In one embodiment, the capacitance of the second capacitor Cst1 is much greater than the capacitance of the first capacitor Ctx1, such that the reduction of voltage level at the fourth node N41 due to charge sharing is very little or negligible.

During the fourth period T41, the fifth transistor M51 and the sixth transistor M61 are turned on (i.e., are in a turn-on state) because the second control signal tx is in a LOW level state and the reset signal reset and the first control signal comp are in a HIGH level state. When the fifth transistor M51 and the sixth transistor M61 are in a turn-on state, an electric current flows from the drive power line VDD to the output line IOUT. At this time, the magnitude of the flowing electric current corresponds to the magnitude represented by the following Equation 3.

$$I_{out}=(Vgs-Vth)^2=(VDD-Vref-\Delta V+Vth-Vth)^2=(VDD-Vref-\Delta V)^2 \quad \text{[Equation 3]}$$

Here, Iout represents an electric current outputted through an output line IOUT, Vgs represents a voltage between a source electrode and a gate electrode of a first transistor M11, Vth represents a threshold voltage of the first transistor M11, VDD represents a voltage transmitted through a drive power line VDD, Vref represents a voltage transmitted through a reference power line VREF, and ΔV represents a voltage increased by a photo diode PD1.

Therefore, an electric current is outputted through the output line IOUT, the electric current corresponding to the magnitude of the electric current generated by the photo diode PD1. The electric current generated by the photo diode PD1 flows regardless of the threshold voltage of the first transistor M11 as represented by the Equation 3. Also, the electric current outputted through the output line IOUT corresponds to the analog sensing signal as shown in FIG. 2.

Figure 5:
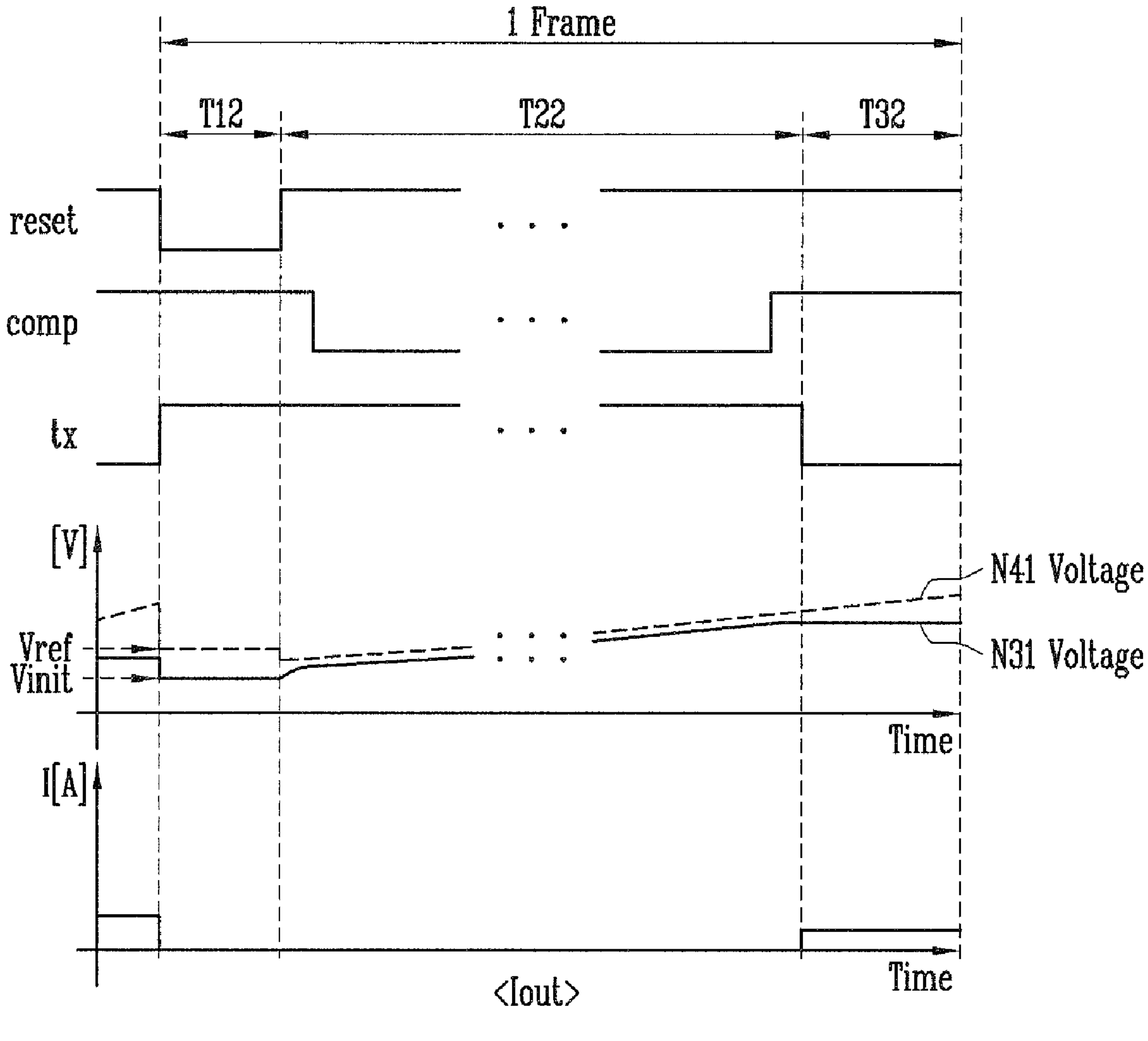
FIG. 5 is a timing diagram showing another exemplary embodiment of the operation of the light sensing unit shown in FIG. 3.

FIG. 5 is a timing diagram showing another exemplary embodiment of an operation of the light sensing unit 211 shown in FIG. 3. Referring to FIG. 5, the light sensing unit 211 is separately driven by a first period T12, a second period T22 and a third period T32 into which one period in one frame is divided. Here, the first period T12 is a period in which a reset signal reset transmitted through the reset signal line RESET is in a LOW level state and a first control signal comp transmitted through the first control signal line COMP and a second control signal tx transmitted through the second control signal line TX are in a HIGH level state. Also, the second period T22 is a period in which the reset signal reset and the second control signal tx are in a HIGH level state and the first control signal comp is in a LOW level state. The third period T32 is a period in which the reset signal reset and the first control signal comp are in a HIGH level state and the second control signal tx is in a LOW level state.

First, during the first period T12, the fourth transistor M41 and the seventh transistor M71 are turned on (i.e., are in a turn-on state) because the reset signal reset is in a LOW level state and the first control signal comp and the second control signal tx are in a HIGH level state. Therefore, the reset voltage Vinit transmitted through the reset signal line VINIT is transmitted to the third node N31, and the reference voltage Vref transmitted through the reference power line VREF is transmitted to the fourth node N41. Therefore, the third node N31 and the fourth node N41 are reset to an initial state by the reset voltage Vinit and the reference voltage Vref, respectively.

During the second period T22, the second transistor M21 and the third transistor M31 are turned on (i.e., are in a turn-on state) because the reset signal reset and the second control signal tx are in a HIGH level state and the first control signal comp is in a LOW level state. At this time, when the light is incident on the photo diode PD1, an electric current (i.e., a reverse current) flows from the cathode electrode to the anode electrode of the photo diode PD1, resulting in the increase in voltage of the fourth node N41. Therefore, the fourth node N41 has a voltage represented by the Equation 1. At this time, the voltage of the fourth node N41 is transmitted to the third node N31 since the second transistor M21 and the third transistor M31 are in a turn-on state. Therefore, a voltage represented by the Equation 2 is generated in the third node N31.

In other words, the voltage of the third node N31 becomes a voltage that is offset by the threshold voltage of the first transistor M11 from the voltage of the fourth node N41. Here, the second period T22 is represented by one period, but it corresponds to two periods, compared to the second period T21 as shown in FIG. 4.

During the third period (T32), the fifth transistor M51 and the sixth transistor M61 are turned on (i.e., are in a turn-on state) because the second control signal tx is in a LOW level state and the reset signal reset and the first control signal comp are in a HIGH level state. When the fifth transistor M51 and the sixth transistor M61 are in a turn-on state, an electric current flows from the drive power line VDD to the output line IOUT. At this time, the magnitude of the flowing electric current corresponds to the magnitude represented by the Equation 3.

Therefore, an electric current is outputted into the output line IOUT according to the magnitude of the electric current generated by the photo diode PD1. The electric current generated by the photo diode PD1 flows regardless of the threshold voltage of the first transistor M11.

Figure 6:
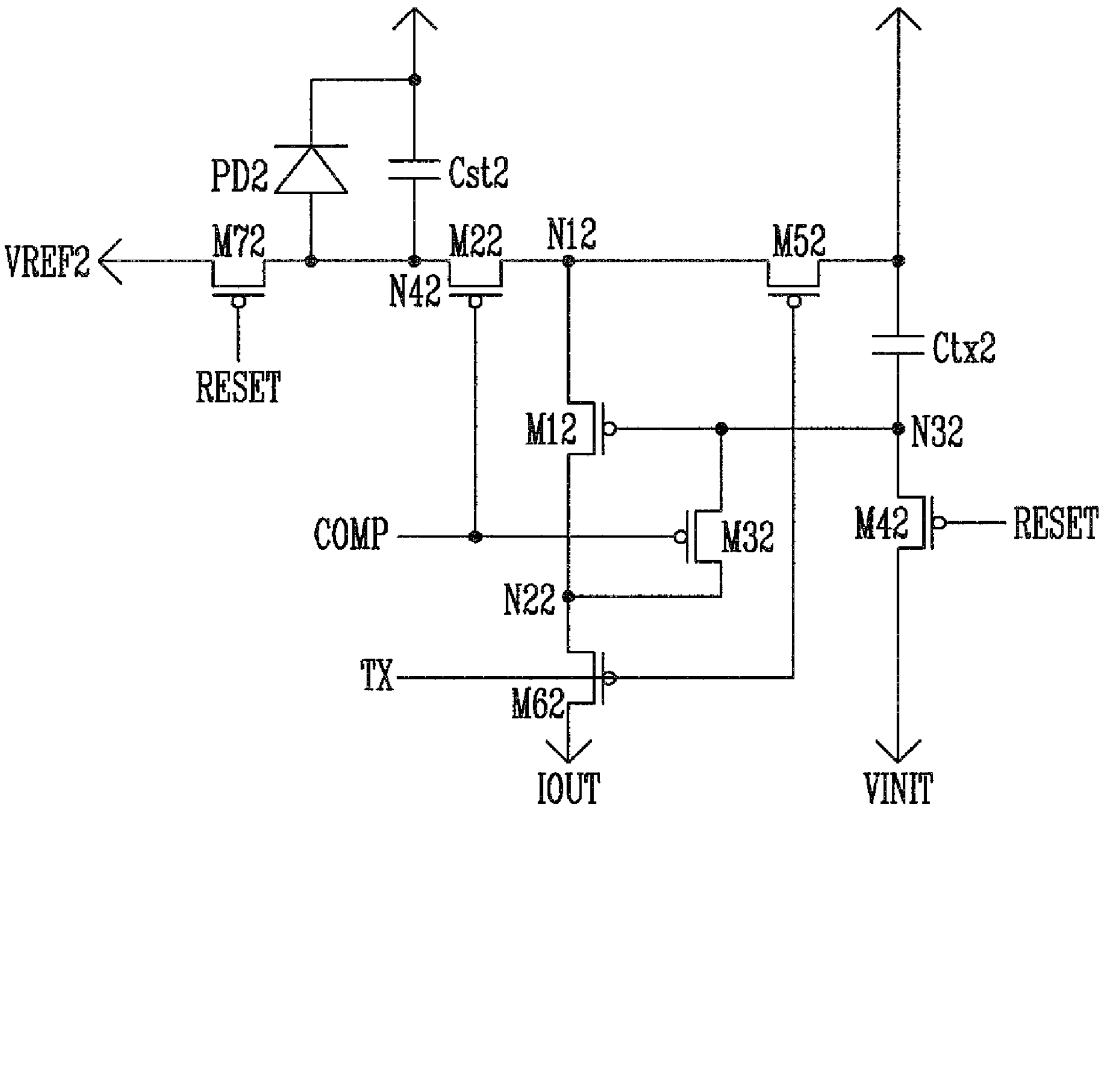
FIG. 6 is a circuit diagram showing another exemplary embodiment of the light sensing unit shown in FIG. 2.

FIG. 6 is a circuit diagram showing another exemplary embodiment of the light sensing unit 211 as shown in FIG. 2. Referring to FIG. 6, the light sensing unit 211 includes a first transistor M12, a second transistor M22, a third transistor M32, a fourth transistor M42, a fifth transistor M52, a sixth transistor M62, a seventh transistor M72, a photo diode PD2, a first capacitor Ctx2 and a second capacitor Cst2.

A source electrode of the first transistor M12 is coupled to a first node N12, a drain electrode of the first transistor M12 is coupled to a second node N22, and a gate electrode of the first transistor M12 is coupled to a third node N32.

A source electrode of the second transistor M22 is coupled to a fourth node N42, a drain electrode of the second transistor M22 is coupled to a first node N12, and a gate electrode of the second transistor M22 is coupled to a first control signal line COMP.

A source electrode of the third transistor M32 is coupled to the second node N22, a drain electrode of the third transistor M32 is coupled to the third node N32, and a gate electrode of the third transistor M32 is coupled to a first control signal line COMP.

A source electrode of the fourth transistor M42 is coupled to a reset signal line VINIT, a drain electrode of the fourth transistor M42 is coupled to the third node N32, and a gate electrode of the fourth transistor M42 is coupled to a reset signal line RESET.

A source electrode of the fifth transistor M52 is coupled to a drive power line VDD, a drain electrode of the fifth transistor M52 is coupled to the first node N12, and a gate electrode of the fifth transistor M52 is coupled to a second control signal line TX.

A source electrode of the sixth transistor M62 is coupled to the second node N22, a drain electrode of the sixth transistor M62 is coupled to an output line IOUT, and a gate electrode of the sixth transistor M62 is coupled to the second control signal line TX.

A source electrode of the seventh transistor M72 is coupled to a second reference power line VREF2, a drain electrode of the seventh transistor M72 is coupled to the fourth node N42, and a gate electrode of the seventh transistor M72 is coupled to the reset signal line RESET.

A cathode electrode of the photo diode PD2 is coupled to a first reference power line VREF1, and an anode electrode of the photo diode PD2 is coupled to the fourth node N42.

A first electrode of the first capacitor Ctx2 is coupled to the third node N32, and a second electrode of the first capacitor Ctx2 is coupled to the drive power line VDD.

A first electrode of the second capacitor Cst2 is coupled to the first reference power line VREF1, and a second electrode is coupled to the fourth node N42, wherein the second capacitor Cst2 is coupled in parallel with the photo diode PD2.

The light sensing unit 211 configured thus performs the operations as shown in FIG. 4 or 5 to amplify an electric current generated in the photo diode PD2 and outputs the amplified electric current.

The photo sensor according to exemplary embodiments of the present invention and the flat panel display using the same may be useful to enhance a dynamic range of the photo sensor by amplifying an electric current outputted from the photo sensor to increase the magnitude of current.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A photo sensor, comprising:

a first transistor having a first electrode coupled to a first node, a second electrode coupled to a second node, and a gate electrode coupled to a third node;

a second transistor having a first electrode coupled to a fourth node, a second electrode coupled to the first node, and a gate electrode coupled to a first control signal line;

a third transistor having a first electrode coupled to the second node, a second electrode coupled to the third node, and a gate electrode coupled to the first control signal line;

a fourth transistor having a first electrode coupled to a reset power line, a second electrode coupled to the third node, and a gate electrode coupled to a reset signal line;

a fifth transistor having a first electrode coupled to a first power source, a second electrode coupled to the first node, and a gate electrode coupled to a second control signal line;

a sixth transistor having a first electrode coupled to the second node, a second electrode coupled to an output line, and a gate electrode coupled to the second control signal line;

a seventh transistor having a first electrode coupled to a second power source, a second electrode coupled to the fourth node, and a gate electrode coupled to the reset signal line;

a photo diode having a cathode electrode coupled to a third power source and an anode electrode coupled to the fourth node;

a first capacitor having a first electrode coupled to the third node and a second electrode coupled to the first power source; and a second capacitor having a first electrode coupled to the third power source and a second electrode coupled to the fourth node.

2. The photo sensor according to claim 1, wherein the reset signal line transmits a reset signal, and the reset signal has a first period in which the fourth transistor and the seventh transistor are in a turn-on state, and a second period, a third period and a fourth period in which the fourth transistor and the seventh transistor are in a turn-off state.

3. The photo sensor according to claim 2, wherein the first control signal line transmits a first control signal, and the first control signal allows the second transistor and the third transistor to be in a turn-on state during the third period, and allows the second transistor and the third transistor to be in a turn-off state during the first, second and fourth periods.

4. The photo sensor according to claim 2, wherein the second control signal line transmits a second control signal, and the second control signal allows the fifth transistor and the sixth transistor to be in a turn-on state during the fourth period and allows the fifth transistor and the sixth transistor to be in a turn-off state during the first, second and third periods.

5. The photo sensor according to claim 2, wherein the first control signal line transmits a first control signal, and the first control signal allows the second transistor and the third transistor to be in a turn-on state during the second period and the third period and allows the second transistor and the third transistor to be in a turn-off state during the first period and the fourth period.

6. The photo sensor according to claim 5, wherein the second control signal line transmits a second control signal, and the second control signal allows the fifth transistor and the sixth transistor to be in a turn-on state during the fourth period and allows the fifth transistor and the sixth transistor to be in a turn-off state during the first, second, and third periods.

7. The photo sensor according to claim 1, wherein the second capacitor has a greater capacitance than the first capacitor.

8. A flat panel display, comprising:

a display unit for displaying an image corresponding to a data signal and a scan signal;

a data driver for receiving an image signal to generate a data signal and transmitting the generated data signal to the display unit;

a scan driver for generating a scan signal and transmitting the generated scan signal to the display unit; and a photo sensor for sensing luminance of an ambient light to control luminance of the image according to the luminance of the ambient light, wherein the photo sensor comprises:

a first transistor having a first electrode coupled to a first node, a second electrode coupled to a second node, and a gate electrode coupled to a third node;

a second transistor having a first electrode coupled to a fourth node, a second electrode coupled to the first node, and a gate electrode coupled to a first control signal line;

a third transistor having a first electrode coupled to the second node, a second electrode coupled to the third node, and a gate electrode coupled to the first control signal line;

a fourth transistor having a first electrode coupled to a reset power line, a second electrode coupled to the third node, and a gate electrode coupled to a reset signal line;

a fifth transistor having a first electrode coupled to a first power source, a second electrode coupled to the first node, and a gate electrode coupled to a second control signal line;

a sixth transistor having a first electrode coupled to the second node, a second electrode coupled to an output line, and a gate electrode coupled to the second control signal line;

a seventh transistor having a first electrode coupled to a second power source, a second electrode coupled to the fourth node, and a gate electrode coupled to the reset signal line;

a photo diode having a cathode electrode coupled to a third power source and an anode electrode coupled to the fourth node;

a first capacitor having a first electrode coupled to the third node and a second electrode coupled to the first power source; and a second capacitor having a first electrode coupled to the third power source and a second electrode coupled to the fourth node.

9. The flat panel display according to claim 8, wherein the reset signal line transmits a reset signal, and the reset signal has a first period in which the fourth transistor and the seventh transistor are in a turn-on state, and a second period, a third period and a fourth period in which the fourth transistor and the seventh transistor are in a turn-off state.

10. The flat panel display according to claim 9, wherein the first control signal line transmits a first control signal, and the first control signal allows the second transistor and the third transistor to be in a turn-on state during the third period, and allows the second transistor and the third transistor to be in a turn-off state during the first, second and fourth periods.

11. The flat panel display according to claim 9, wherein the second control signal line transmits a second control signal, and the second control signal allows the fifth transistor and the sixth transistor to be in a turn-on state during the fourth period and allows the fifth transistor and the sixth transistor to be in a turn-off state during the first, second and third periods.

12. The flat panel display according to claim 9, wherein the first control signal line transmits a first control signal, and the first control signal allows the second transistor and the third transistor to be in a turn-on state during the second period and the third period and allows the second transistor and the third transistor to be in a turn-off state during the first period and the fourth period.

13. The flat panel display according to claim 12, wherein the second control signal line transmits a second control signal, and the second control signal allows the fifth transistor and the sixth transistor to be in a turn-on state during the fourth period and allows the fifth transistor and the sixth transistor to be in a turn-off state during the first, second and third periods.

14. The flat panel display according to claim 8, wherein the second capacitor has a greater capacitance than the first capacitor.

* * * * *